United States Patent [19]

Bode

[11] 4,399,326
[45] Aug. 16, 1983

[54] AUDIO SIGNAL PROCESSING SYSTEM

[76] Inventor: Harald E. W. Bode, 1344 Abington Pl., North Tonawanda, N.Y. 14120

[21] Appl. No.: 223,951

[22] Filed: Jan. 12, 1981

[51] Int. Cl.³ .............................................. H03H 7/19
[52] U.S. Cl. ............................... 179/1 D; 84/DIG. 9; 179/1 F
[58] Field of Search ............ 179/1 B, 1 D, 1 J, 1 VL, 179/1 M, 1 FS, 1 F; 84/DIG. 9, DIG. 10, DIG. 26; 330/107

[56] References Cited

U.S. PATENT DOCUMENTS

| | | | |
|---|---|---|---|
| 3,719,782 | 3/1973 | Barnum | 84/1.24 |
| 3,800,088 | 3/1974 | Bode | 179/1 J |
| 3,842,204 | 10/1974 | Leslie | 179/1 J |
| 3,920,905 | 11/1975 | Sharp | 179/1 J |
| 3,980,828 | 9/1976 | Orban | 179/1 J |
| 4,063,034 | 12/1977 | Peters | 84/DIG. 26 |

*Primary Examiner*—G. Z. Rubinson
*Assistant Examiner*—Randall P. Myers
*Attorney, Agent, or Firm*—Martin LuKacher

[57] ABSTRACT

An audio signal processing system for producing a moving comb filter effect having an all pass phase filter or other suitable phase shifting device in a first input branch and a bypass circuit with an optional inverter in a second input branch. A frequency shifter is inserted either into the first or the second input branch. A first summing network is connected to the outputs of the first and second input branch. An optional second summing network is connected to the output of the first input branch and the inverted output of the second input branch. A feedback circuit may be connected between the output of one of the summing networks to the input of the system to enhance the moving comb filter effect. Also, at least one switching circuit may be used to obtain phase reversals in the frequency shifter thereby facilitating up or down detuning or successive up and down detunings of the comb filter frequencies.

20 Claims, 6 Drawing Figures

AUDIO SIGNAL PROCESSING SYSTEM

DESCRIPTION

This invention relates to audio signal processing systems for modifying the overtone structure of audio signals. More particularly it deals with a signal processing system which produces moving comb filter effects.

The invention is especially suitable for use in electronic music systems, such as music synthesizing systems, to obtain special musical sound effects. The invention is also applicable for the processing of any musical program material, speech, ambient sounds, or other audio program material to obtain special sound effects therewith.

In known systems, sometimes called "Phasers" and "Flangers", the comb filter effect is produced by summing the direct signal (or its inverted counterpart), which is to be processed, received from the system input with the output signal of a suitable phase shifting device, including but not limited to a multistage all pass phase filter, which produces a total phase shift of 180° in each stage. Thus the total phase shift for n stages will be $n \times 180°$, where n is the number of stages. In summing the phase shifted with the direct input signal, the frequencies with 0° and multiples of 360° phase shift will be added in amplitude, resulting in peaks, and the frequencies with $(1+2n) \times 180°$; $(n=0, 1, 2, \ldots)$ will be subtracted resulting in notches. By changing the values of the frequency and phase determining components, for instance resistors in the R/C combinations in a conventional type of all pass phase filter, the total phase shift is modulated and the resulting peaks and notches (the comb filter resonances) move up and down in frequency. Only periodic up and down detuning of the comb filter resonances is achieved. Reference may be had to Bartlett, J. Audio Eng. Soc., 6, 674 (1970) for further information concerning such known systems.

In a system according to this invention, a frequency shifter capable of very low shift frequencies is used together with a phase shifting device, which may be an all pass phase filter or other suitable phase shifting device, including delay lines, wherein all frequency components are passed, but with phase shifts varying with frequency over the spectral region where the comb filter effect is to be emphasized (called an "all pass phase shifter" herein), and a summing network. The all pass phase shifter may be connected serially with the frequency shifter, to the systems input to which the input signal to be processed is applied, and the output of the frequency shifter is connected to one side of the summing network, the other side of which receives the input signal either directly or through an inverter from the systems input; alternatively, the frequency shifter may be connected in the direct signal path between the systems input and one side of the summing network, the other side of which receives the input signal through the all pass phase shifter, directly or through an inverter.

A principal object of this invention is to provide an improved audio signal processing system for providing comb filter effects without the limitations of, and with greater flexibility of response than, known systems for similar purposes, such as "Phasers" and "Flangers."

A further object of this invention is to provide an improved comb filter system in which a plurality of all pass phase filters of simplest design can be used.

Another object of this invention is to provide an improved comb filter system in which unidirectional detuning or automatic up and down detuning can be obtained.

Still another object of this invention is to provide an improved comb filter system having manually controllable detuning capabilities.

Briefly, the invention provides an improved audio signal processing system involving the use of (1) a frequency shifter capable of very low shift frequencies (e.g. 0-6 Hz), (2) an all pass phase filter or other suitable phase shifting device, including delay lines (called an all pass phase shifter herein), and (3) at least one summing network, alone or in combination with a feedback circuit and/or switching circuitry for polarity reversals.

Other novel features of this invention, together with further objects and advantages thereof, will become more readily apparent when considered in connection with the accompanying drawings showing presently preferred embodiments thereof, in which:

FIG. 1 is a block, schematic diagram of an audio signal processing system according to an embodiment of the invention with a serial arrangement of an all pass phase shifter and a frequency shifter, a direct and an inverting bypass circuit, three output summing networks and a feedback circuit;

FIG. 2 is a block, schematic diagram of an audio signal processing system according to another embodiment of the invention with a frequency shifter between the systems input and one side of two output summing networks and a phase shifting device in the bypass circuit followed by a direct communication to the other side of one of the summing networks, an inverted connection to the other side of the second summing network, and a feedback circuit;

Figure 3:
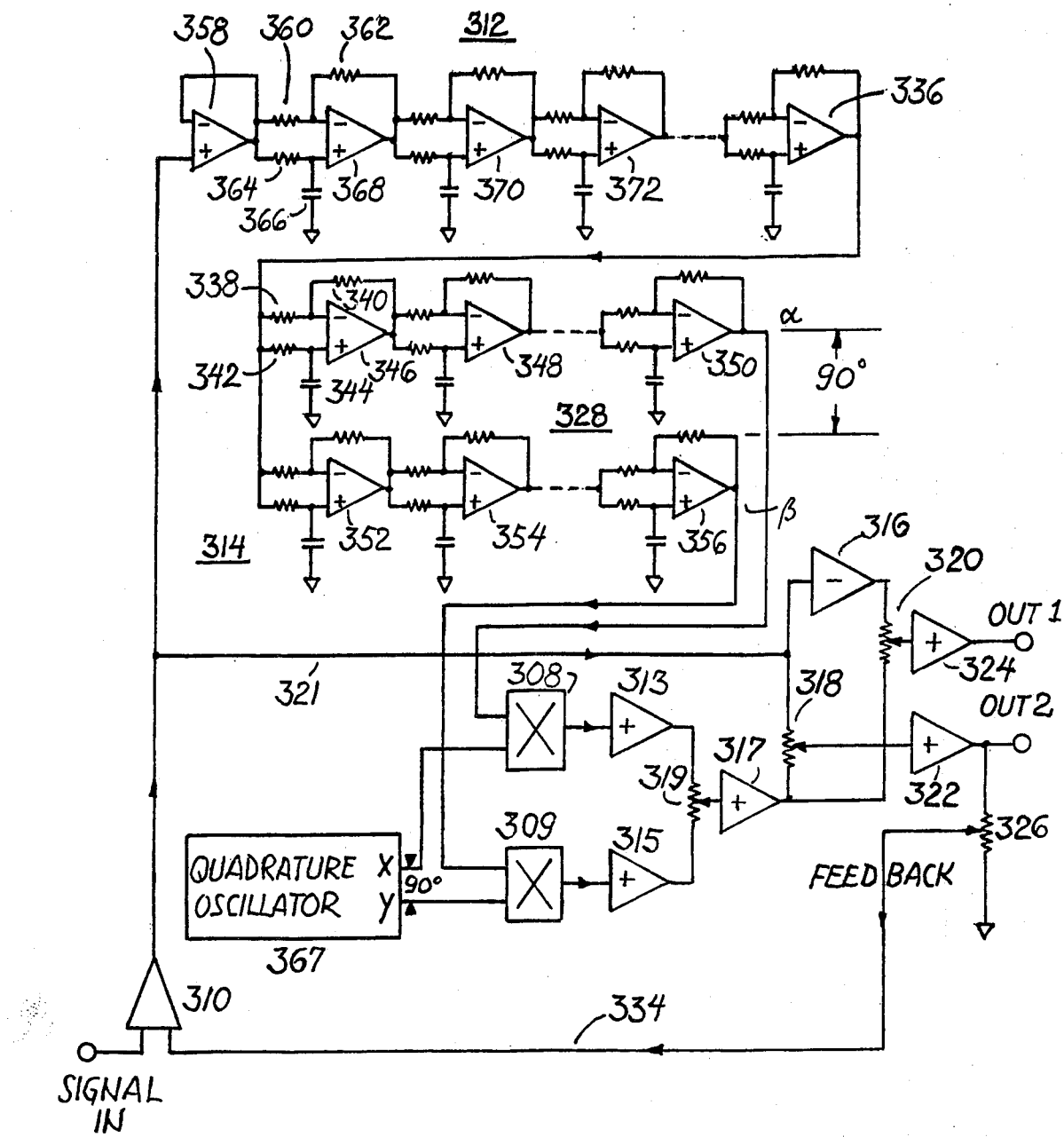
FIG. 3 is a block, schematic diagram of an audio signal processing system showing the embodiment of the invention illustrated in FIG. 1 in greater detail, particularly as regards the all pass phase shifter and the phase shifting circuitry of the frequency shifter.
Figure 4:
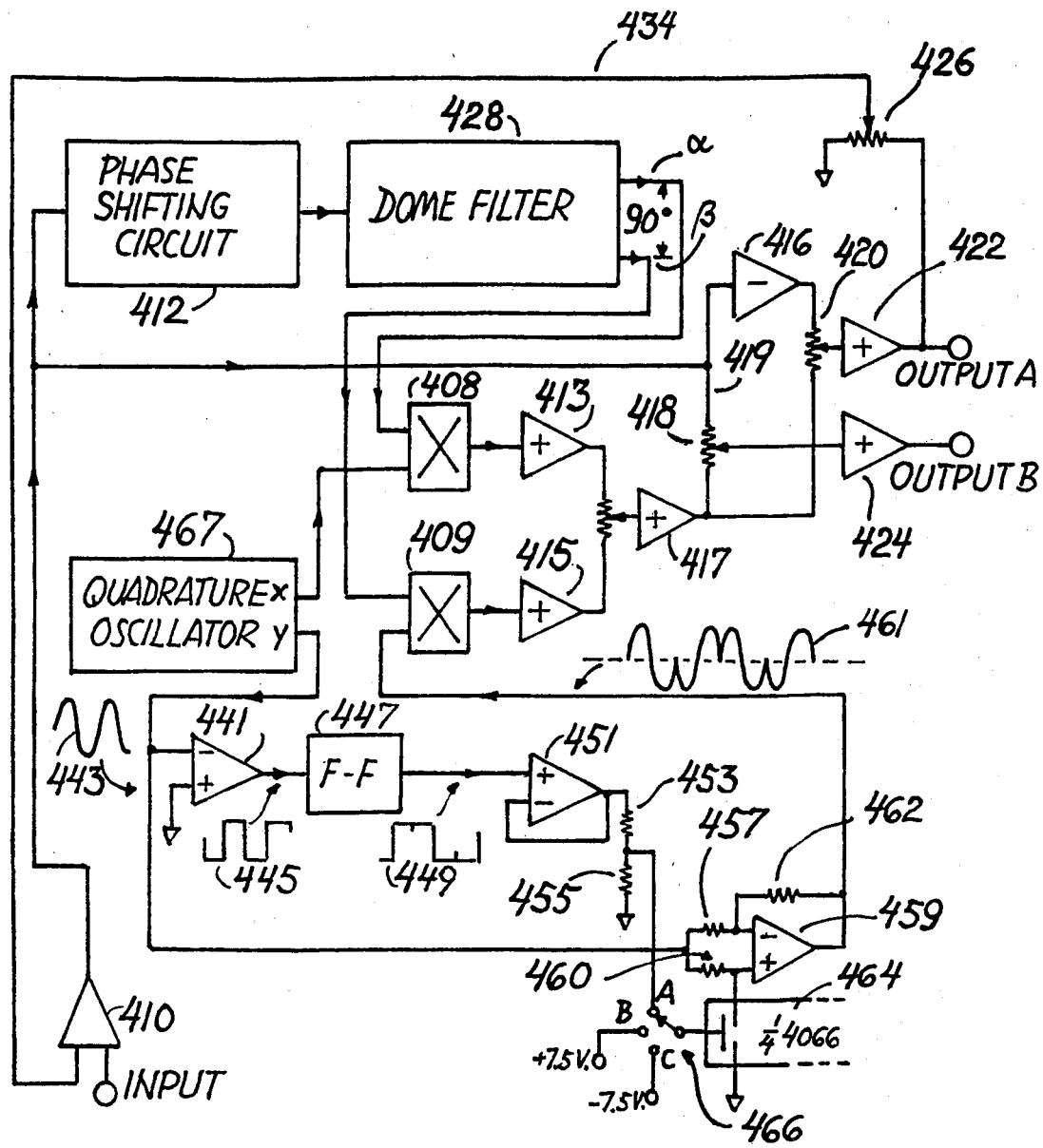
FIG. 4 is a block, schematic diagram of an audio signal processing system similar to the system shown in FIGS. 1 and 3, and having an automatic reversal circuit for periodic up and down detuning of the comb filter resonances.
Figure 5:
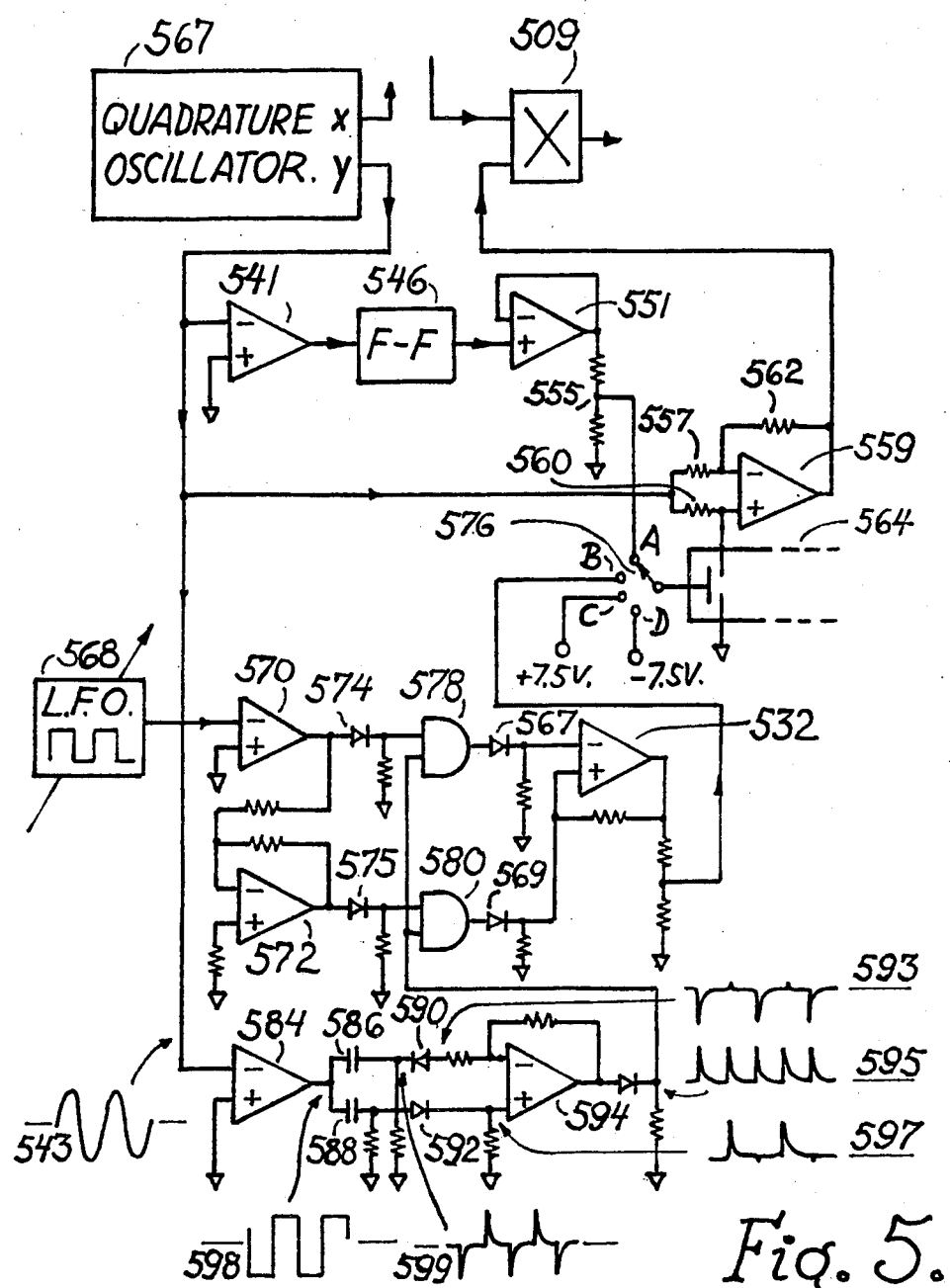
Figure 6:
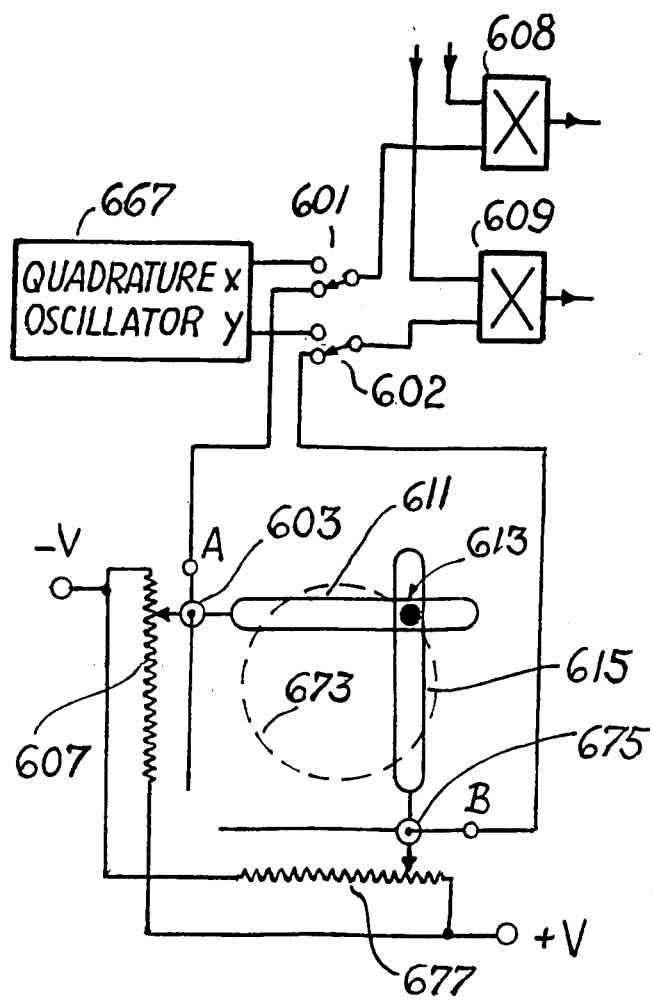

FIG. 5 is a block, schematic diagram showing an automatic reversal circuit, similar to that shown in FIG. 4 and having additional circuitry for periodic and quasi-periodic up and down detuning of the comb filter resonances of the audio signal processing system shown in FIG. 3; and FIG. 6 is a block and mechanical diagram schematically showing a portion of an audio signal processing system according to the invention using a rotary manual actuator, also known as a Joystick.

Figure 1:
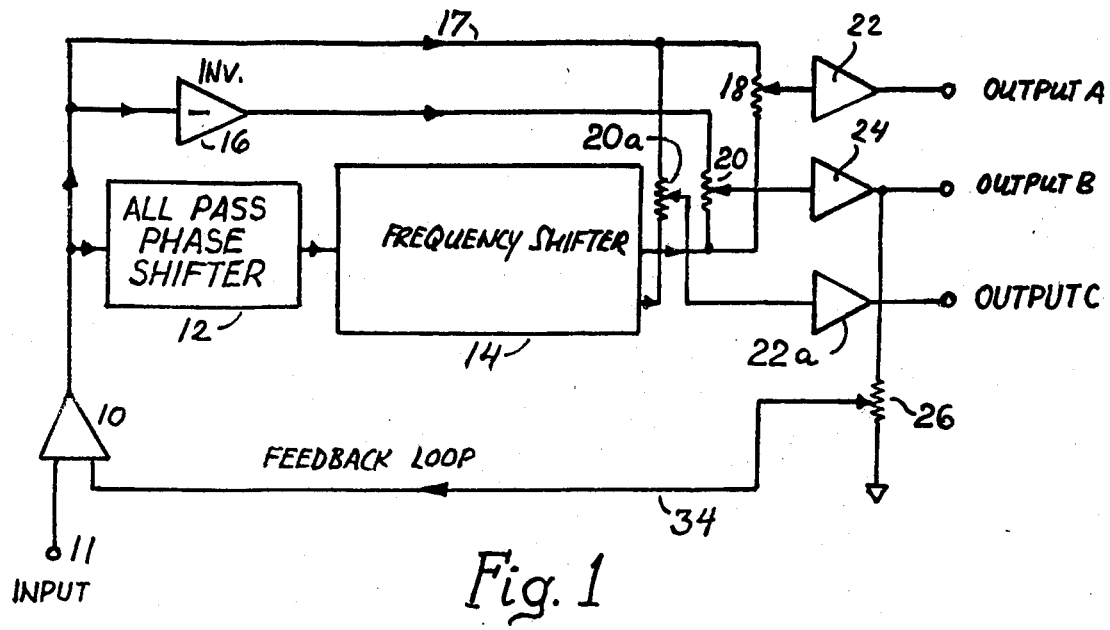

In FIG. 1, the input audio signal containing the program material, i.e., the signal to be processed, is applied to an input terminal 11, which is connected to the left input terminal of a mixer amplifier 10, which is an operational amplifier having a pair of summing inputs, one for the input signal and the other for a feedback signal. Both the input and feedback signal are summed in the mixer 10. The output of this mixer 10 is connected to the input of an all pass phase shifter 12 and subsequently through a frequency shifter 14 with two outputs for frequency shifts in opposite directions, one of these outputs connecting to one side of each of a pair of summing potentiometers 18 and 20. The output of the mixer 10 is also connected to an inverting stage 16, the output of which connects to the other side of the summing potentiometer 20; and finally the output of the mixer 10 connects directly to the other side of the summing potentiometer 18. The wiper arms of the potentiometers 18 and 20 are connected to output amplifier stages 22 and 24, respectively. The feedback signal is obtained via circuit 34 from a potentiometer 26 connected to the output stage 24, through which a controllable signal is fed back to the systems input at the right input of the input mixer 10. The second output of the frequency shifter 14 connects to one side of the summing potentiometer 20a, the other side of which is connected to the output of the mixer 10. The wiper arm of the potentiometer 20a is connected to the output amplifier stage 22a. The system outputs A and C from the output amplifier stages 22 and 22a have comb filter resonances, which move in opposite directions. With phase lag introduced in the phase shifter 12 and frequency shifter 14, the comb filter resonances at output A are detuned up, when they are detuned down at output C.

Figure 2:
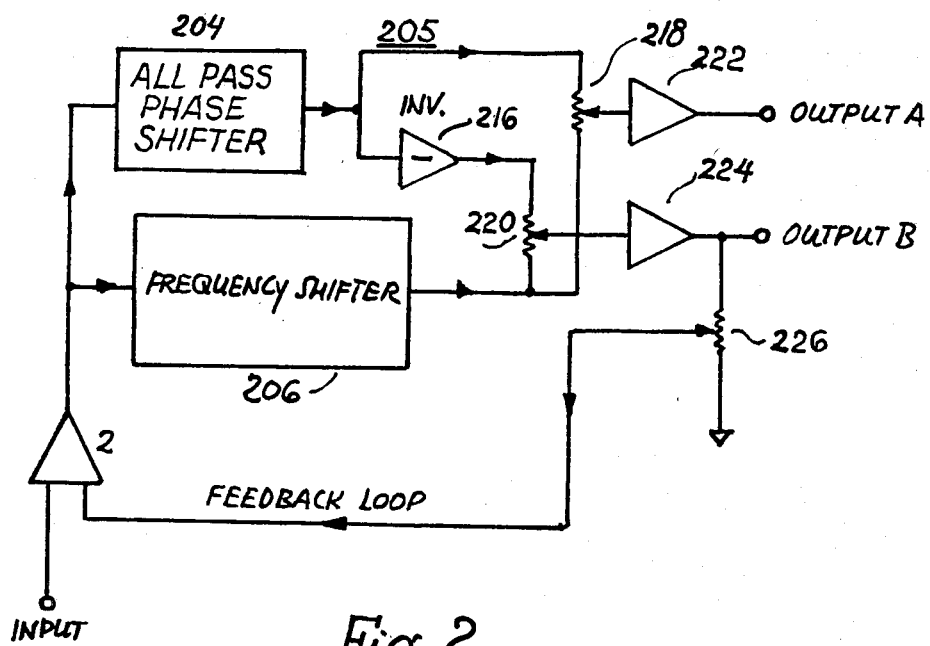

FIG. 2 differs from FIG. 1 mainly by the location of the all pass phase shifter 204, which in FIG. 2 is not arranged in series with the frequency shifter 206 but in a bypass circuit 205 with its output connected directly to a summing potentiometer 218 and with its inverted output connected to a summing potentiometer 220; the other ends of the summing potentiometers receiving the signal from the output of the frequency shifter 206. It will be noted that like parts in each illustrated embodiment of the invention have the same last two lower order digits in their reference numerals. For instance, summing potentiometers 18 and 218 are alike in structure and operation.

For the understanding of the comb filter detuning function provided by the circuits shown in FIGS. 1 and 2, consider FIG. 3 which shows an all pass phase filter 312 as well as the all pass phase shifter 314 and frequency shifter of FIG. 1 in more detail. First special attention is given to some of the performance characteristics of the frequency shifter, which provide the comb filter detuning effect.

The frequency shifter 314 is preferably of the type described in Bode, U.S. Pat. No. 3,800,088 and Bode & Moog, J. Audio Eng. Soc., 20, 453 (July/Aug. 1972). More particularly, the frequency shifter 314 contains a group 328 of two all pass phase shifting filter chains; namely an upper chain with operational amplifiers shifting sections 346 through 350 and a lower chain with operational amplifier sections 352 through 356. This group 328 of all pass phase filters is also referred to as "Dome" filter. The sections have "center" frequencies equally spread over the audio frequency range in such a way that the cumulative phase shift of one chain is always ninety degrees different from that of the other chain over the specified audio range. A single multistage all pass phase filter, containing operational amplifier sections 358 through 336, which will be discussed later, provides the all pass phase shifter 312.

The component values for the two all pass phase shifter chains of the Dome filter 328 are chosen such that the cumulative phase shifts between the output terminals alpha and beta differ by 90° over the performance frequency range of the system (for instance from 20 Hz to 20 kHz). The output signals at the alpha and beta terminals therefore have a sine/cosine relationship. The frequency shifter 314 also has a quadrature oscillator 367 which is preferably of a design described in Bode, U.S. Pat. No. 4,145,670, and which is variable in frequency, for example over a 0 to 6 Hz range. The range 0 to 1 Hz is preferably used. Multipliers 308 and 309, preferably of the four quadrant type, the outputs of which are applied to buffer amplifiers 313 and 315, summed in potentiometer 319 and applied to a buffer amplifier 317 are also included in the frequency shifter 314. The output signals of the quadrature oscillator 367 also have a sine/cosine relationship.

As described in the above referenced article and U.S. Pat. No. 3,800,088, a frequency shifted signal is obtained at the summing point of multipliers 308 and 309 (the wiper of the potentiometer 319, FIG. 3). Depending upon the phase relationships of the alpha and beta outputs of the all pass phase filter chains of the Dome filter 328 and the X and Y outputs of the quadrature oscillator 367, the frequency of the input signal entered at the input mixer 310 is shifted either up or down by the frequency of the quadrature oscillator 367.

Assuming now a special case, in which the frequency of the quadrature oscillator 367 goes to zero, then due to the sine/cosine relationship of the quadrature oscillator output voltages, the output X can become a maximum level and the output Y level becomes about zero. In this case only the multiplier 308 passes the signal of the all pass phase filter chain with the alpha output.

Assuming now, for example, that each of the all pass phase filter chains of the Dome filter 328 has 6 sections (and still disregarding the input multistage all pass phase filter 312 with operational amplifiers 358 through 336), then, since each section yields a maximum phase shift of 180° (the operational amplifiers in each stage becoming inverting when their direct inputs are shunted to ground at the high end frequencies), the 6 stages would yield a maximum phase shift of 1080° over the frequency range of the system (for instance 20 to 20,000 Hz). In the described assumed case, this phase shift is propagated through the multiplier 308 and the buffer 313 to the output of the frequency shifter output stage 317.

If now this output signal is summed at the potentiometer 318 with the input signal bypassed through the direct line 321, the same happens as would be the case without the multipliers, namely, the amplitudes at frequencies with 0° and multiples of 360° phase shift are doubled resulting in peaks, and at frequencies with $(1+2n) \times 180°$ (where $n=0, 1, 2, \ldots$) phase shift are subtracted or cancelled out. It will be noted that circuit delays can be neglected as a practical matter due to the changes in the program material being slow compared to these circuit delays.

Now by changing the quadrature oscillator 367 from a frequency of 0 Hz to 1 Hz, for example, the input frequency will appear shifted either up or down by 1 Hz at the output stage 317, and the peaks and notches produced by summing the shifted signal with the bypassed signal (the comb filter) will start to continually move up (or down) in frequency, returning to the same peak/notch pattern once every second.

In the assumed (simplified) systems configuration, the input signal to the frequency shifter, is received directly at the input of the six stage Dome filter 328, the maximum number of 3 peaks and notches are spread out over the entire frequency range of, for instance, 20 to 20,000 Hz, which makes their spacing too large, so that a typical comb filter effect will not be preceived. However, by including the additional all pass phase shifter 312 shown at the systems input in FIG. 3 and represented by the all pass phase filter having the operational amplifiers 368, 370 and 372 through 336 (and preceded by the input buffer stage with an operational amplifier 358), a very effective comb filter effect can be produced. The peaks and notches of the comb filter continually move up or down in frequency and then return to the same peak/notch pattern, at the frequency of the quadrature oscillator.

In order to provide the added input phase shifting device 312 (in the illustrated case, selecting an all pass phase filter) which is most effective, its major phase shift should take place in a frequency range, in which the produced peaks and notches are most noticable. This would be a frequency range, which is most significant for tone color perception, such as for instance from 300 Hz to 1500 Hz. Furthermore a larger number of phase shifting sections in the filter 312, such as for instance twelve, will result in a larger number and closer spacing of the resulting peaks and notches, which will add to the effectiveness. Even a much larger number of stages, such as 30 to 40, would be feasible and would lead to interesting multifilter effects. In the case of using a delay line (a special kind of phase shifting device and another example of an all pass phase shifter which can be used in accordance with the invention) a typical delay time of 10 milliseconds will be useful. The delay line may be of the bucket brigade type, with the number of stages and shift pulse rate chosen to provide the necessary phase shift. The resulting tonal effect will vary largely with the delay time used.

The resonance peaks produced in a system according to the invention can be made to sound more pronounced, noticable and interesting by activating the feedback circuit 334, such as the circuit shown in FIG. 3, with potentiometer 326, the feedback path, and the right summing input into the input stage 310. Potentiometer 326 can be adjusted to a point just before the start of oscillations, at which point the comb filter peaks perform like those of resonance filters with a very high Q. Either the direct output A can be fed back, as shown in FIG. 3 or the complementary output B, as shown in FIGS. 1 and 2.

In order to make a system according to this invention more flexible, it may be desirable to expand its performance to beyond up or down detuning of the comb filter frequencies by providing the capability of periodic and quasi periodic up and down detuning. Such a system for facilitating selective up or down detuning and periodic up and down detuning is shown in FIG. 4.

The basic system configuration of FIG. 4 resembles that of FIG. 3 with one exception. The output signal Y of the quadrature oscillator 467 is not fed directly to the lower input terminal of multiplier 409, but is fed instead through an inverting/non-inverting circuit comprising a comparator 441, a flip-flop 447, a voltage level setting follower stage 451, and the inverting/non-inverting stage 459 having an analog shunting switch 464 from its non-inverting input to ground. The switch 464 may suitably be part of an FET gate integrated circuit, such a type CD 4066 available from RCA Corporation.

By inverting one of the quadrature oscillator 467 output signals to one of the multiplier 409 inputs, a reversal of the sign of the frequency shift and of the comb filter frequency detuning is achieved. By a periodic sequence of inversion and non-inversion of this output signal from the quadrature oscillator 467 to the multiplier 409 input, a periodic up and down detuning of the comb filter frequencies will result.

In the operation of the inverting/non-inverting circuit of FIG. 4, the sinusoidal (or cosine) output signal from the quadrature oscillator is applied to the comparator 441 and to the inverting/non-inverting stage 459. This stage contains an operational amplifier 459, resistors 457, 460 and 462 and the analog switch 464. The quadrature oscillator output signal appears between the non-inverting input of the operational amplifier 459 and ground. Resistors 457, 460 and 462 are of equal size, for example 20 kOhm. With the analog switch 464 open (negative control voltage at its control electrode), the amplifier 459 operates as a non-inverting stage. With the analog switch closed (positive control voltage), the amplifier 459 operates as an inverter.

It is important to make all transitions from inversion to non-inversion at the zero crossing point of the quadrature oscillator output signal 443 so as to avoid transient distortions thereof, colloquially called glitches. This is achieved in the control circuit comprising comparator 441, flip-flop 447 and the follower 451. At the zero crossings of the sine (cosine) wave 443, the output of the comparator 441 flips from one polarity to the opposite, producing a square wave 445, which is frequency divided (2:1) in flip-flop 447, resulting in the square wave 449 and remaining the same shape at the output of the level shifting follower 451. The voltage divided with resistors 453 and 455 (of equal size) produces a control voltage of the correct level required for the analog switch 464 (provided that the supply voltages for the operational amplifier 451, such as the common type uA 741, are +15 and −15 volts and for the type 4066 switch are +7.5 and −7.5 volts DC.). Depending on the choice of integrated circuit for the flip-flop 447, a comparator/level changer may be used instead of the follower 451. The waveshape 461 obtained at the output of the operational amplifier 456 shows a polarity change after each full cycle, with the three pole switch 466 in the position A, as shown.

With switch 466 in position B, a positive potential is applied to the control electrode of the analog switch 464, which makes this analog switch conductive. The stage with operational amplifier 459 then becomes an inverter. This causes the comb filter detuning to go in the opposite direction of that obtained, when connecting output Y of the quadrature oscillator 467 directly to the lower input of multiplier 409. When switch 466 is in position C, a negative control potential is applied to analog switch 464, which now opens, thus making the stage with operational amplifier 459 a non-inverting stage, and causing a comb filter detuning of the same direction as obtained with the direct connection from the Y output of the guadrature oscillator 467 to the lower input of the multiplier 409.

In order to make a system according to this invention even more flexible than shown in FIG. 4, the inverting/non-inverting switching system shown in FIG. 5 may be used. Only the portion of the overall system associated with the inverting/non-inverting switching system are shown, namely the quadrature oscillator 567, the multiplier 509, the comparator 541, the flip-flop 546, and the follower 551, the inverting/non-inverting operational amplifier stage 559, and the analog switch 564.

In addition, the circuit of FIG. 5 comprises a low frequency oscillator (L.F.O.) 568, which determines the reversal rate of the comb filter frequencies independent of the amount of frequency shift ("drift rate") selected by the quadrature oscillator 567.

Since, as described earlier, reversals must and may only take place at zero crossings of the quadrature oscillator signal in order to avoid glitches, a logic and switching circuit is employed, which contains a comparator 570, an inverter 572, two diodes 574 and 575 with associated shunt resistors between their cathodes and ground, and two AND gates 578 and 580, followed by two diodes 567 and 569. The two diodes are connected to the inverting and non-inverting inputs of a comparator connected as a Schmidt-trigger circuit 532. The logic and switching circuit also includes a zero crossing pulse generator which contains another comparator 584, capacitors 586 and 588 with reference resistors from their outputs to ground, diodes 590 and 592, and a operational amplifier 594 with an output diode and a shunt resistor between its cathode and ground.

For most effective operation of this circuit, the frequency of the quadrature oscillator 567 should be relatively higher (for instance 0.5 Hz) than that of the L.F.O. (for instance 0.1 Hz). When the output voltage of the L.F.O. 568 is positive, the output of comparator 570 will be negative, and diode 574 will be non-conductive. Furthermore the output of the inverter 572 will be positive and diode 575 will conduct. A positive potential is then applied to the input of AND gate 580. However, the output of the gate 580 will only become positive, when its second input, connected to the output of operational amplifier 594, also becomes positive. This will happen, when the output of quadrature oscillator 567 crosses the zero line (ground amplitude level), at which point the output of the comparator 584 flips from one polarity to the opposite, producing a square wave shape shown at 598 at the quadrature oscillator frequency. After differentiation in the capacitor 586 and 588 and resistor combinations, the square wave 598 becomes the spike shape that is typically shown at 599. At the outputs of diodes 590 and 592, the waveshapes shown at 593 and 597 are produced. Due to the inversion of the waveshape 593 and the non-inverted passing of the waveshape 597 in the stage 544, a composite pulse train 595 is obtained, in which each positive pulse represents one zero crossing.

These pulses are received at the second inputs of the AND gates 578 and 580, and will activate that AND gate 578 or 580, the first input of which is of positive potential. The positive going pulses at the outputs of the AND gates 578 and 580 will flip the bistable, Schmidt-trigger circuit 532 from one state to the other and will supply either a positive or a negative control voltage through terminal B of a four pole switch 576 to the analog switch 564, thus making 559 either an inverting or a non-inverting stage, thereby facilitating the successive up and down detuning of the comb filter frequencies of the overall system.

A further addition to a system according to the invention may be implemented by the inclusion of a rotary manual actuator, also known as a Joystick as shown in FIG. 6. Only the quadrature oscillator 667 and the two four-quadrant multipliers 608 and 609 of the overall system are shown in FIG. 6. An input of each multiplier is connected to double pole double throw switches 601 and 602 and receive two signals either from the X and Y outputs of the quadrature oscillator 667 or from the terminals A and B of the Joystick system. In the Joystick system, two potentiometers 607 and 677 are electrically arranged between the positive and negative supply terminals +V and −V. The wiper slide arms 603 and 675 of the potentiometers 607 and 677 connect the terminals A and B to the multiplier 608 and 609 inputs. Two slotted slide members 611 and 615 accomodate the shaft 613 of the manually actuable Joystick. If, for instance, the shaft 613 is moved on a circular path such as shown by way of example by the dash line 673, then two output voltages in sine/cosine relationship are produced at terminals A and B and any up and down movement of the comb filter resonances can be produced at will.

A number of modifications of or addition to the systems and circuits described herein, within the scope of the invention, may occur to those skilled in the art. These may, for instance, include the use of frequency shifters with two outputs, one for up detuning and one for simultaneous down detuning of the input signal such as described in connection with FIG. 5 of the above referenced paper by Bode and Moog. Such another output C is shown in FIG. 1 and is provided by another summing potentiometer 20a and another output amplifier 22a. In the resulting system the additional frequency shifter output may be connected to additional summing networks for summing the additional output with the direct and the inverted input signal. All pass phase filters of the phase lag type are used in the systems illustrated in FIG. 3. These filters may also be of the phase lead type as by having the phase shift determining capacitor in the series branch and the resistor in the shunt branch. In other words the phase shift in the same branch should be in the same direction, either lag or lead. In systems configurations such as shown in FIG. 2, it will be advantageous to use phase lead type all pass phase filters 204 in the parallel branch or bypass channel 205, when phase lag type filters are used in the frequency shifter 206, (i.e., phase shifts in opposite directions in the parallel branches) in order to prevent partial counteraction of the cumulative phase shift obtained in one channel by the phase shift of the other channel. The parallel branch configuration may have the all pass phase shifter 204 connected to the output of one of the filter chains in the Dome filter 328.

The logic and switching circuits presented in FIG. 4 and FIG. 5 may be subject to a number of modifications and additions, which will occur to those skilled in the art. For example, a rotary switch may be placed at the inverting input of comparator 570 in FIG. 5, connecting this input either to the output of the L.F.O. 578 or to a positive or a negative supply voltage.

Various other modifications within the spirit and scope of the invention will no doubt occur to those skilled in the art. Accordingly, the herein described system configurations should be considered illustrative, and not in a limiting sense.

I claim:

1. An audio signal processing system for producing a moving comb filter effect upon an input audio signal, said system comprising frequency shifter means for shifting audio signals in frequency, such frequency shifts being over a range including frequencies equal and less than one Hz, all pass phase shifter means, at least one summing circuit means for providing at least one output signal, first and second parallel branches for applying said input signal to said summing circuit means, said first branch including said frequency shifter means, said all pass shifter means being connected in one of said first and second branches.

2. The system according to claim 1 wherein said all pass phase shifter means is operative to provide greater shift in phase over the portion of the audio frequency range where tone color is principally perceived than elsewhere in said audio frequency range.

3. The system according to claim 2 wherein said portion of said range is from about 300 to about 1500 Hz.

4. The system according to claim 1 wherein said all pass phase shifter means is an all pass phase filter having a plurality of amplifier stages in series.

5. The system according to claim 1 wherein said frequency shifter means comprises a group of all pass filters for producing 90 degree phase related outputs.

6. The system according to claim 5 wherein said all pass phase shifter and said all pass filters in said group each include means for providing phase shift in the same direction, and said all pass phase shifter means and said frequency shifter means are connected in series in said first branch.

7. The system according to claim 5 wherein said all pass filters in said group and said all pass phase shifter include means for providing phase shift in said group all pass filters in a direction opposite from the phase shift in said all pass phase shifter means, said all pass phase shifter means being connected in said second branch, and said frequency shifter means being connected in said first branch.

8. The system according to claim 5 wherein said frequency shifter means further comprises quadrature oscillator means also producing 90 degree phase related outputs, first and second multiplier means, means for summing the outputs of said first and second multiplier means to provide said frequency shifter means output, and means for applying different pairs of outputs from said quadrature oscillator and said group of all pass filters to different ones of said multipliers.

9. The system according to claim 8 further comprising switching means for providing polarity reversals in one of said quadrature oscillator outputs which is applied to an input of one of said multipliers.

10. The system according to claim 9 wherein said switching means comprises an inverting/non-inverting stage between said quadrature oscillator output and said multiplier input, and means responsive to the zero crossing of said quadrature oscillator output for switching the operation of said stage between inverting and non-inverting conditions.

11. The system according to claim 10 wherein said inverting/non-inverting stage comprises an operational amplifier, an analog switch connected to the input of said operational amplifier and responsive to a control voltage for converting said operational amplifier from inverting to non-inverting operating condition, and said means responsive to said zero crossings being operative to generate said control voltage.

12. The system according to claim 11 wherein said means responsive to zero crossings comprises a comparator, a binary divider, and an output stage supplying said control voltage to said analog switch to cause said inverting/non-inverting operational amplifiers stage to pass or invert the quadrature oscillator output signal applied to said one multiplier, said comparator, divider and output stage being connected in tandem.

13. The system according to claim 11 wherein said means responsive to zero crossings comprises a comparator, an input switch receiving an input signal from a low frequency oscillator or a positive or a negative supply source, the output of said comparator being connected through a diode to the first input of a first AND gate and to the input of an inverter, and the output of said inverter being connected through a diode to the first input of a second AND gate, and said output of said quadrature oscillator being connected to a zero crossing pulse generating circuit with an input comparator, the output of said comparator being connected through a first capacitor and diode to the inverting input of an operational amplifier receiving differentiated negative pulses at said input and also being connected through a second capacitor and diode to the non-inverting input of said operational amplifier receiving differentiated positive pulses, and the output of said operational amplifier supplying a series of positive pulses (representative of all of the zero crossings) to the second inputs of the first and second AND gate, the outputs of said AND gates being connected through diodes to the inverting and non-inverting inputs of a Schmidt-trigger, the output of which supplies the control voltage for said analog switch.

14. The system according to claim 8 further comprising switching means connecting inputs of each of said multipliers to the outputs of said quadrature oscillator comprising Joystick manual actuator means comprising two potentiometers arranged between means providing positive and a negative supply voltages for supplying two quadrature signals to the inputs of said multipliers in accordance with the actuator motions around a circular path.

15. The system according to claim 1 further comprising feedback circuit means for combining said output signal with said input signal and applying said combined signals to said branches.

16. The system according to claim 1 further comprising second summing circuit means for providing a second output signal, means for applying the outputs of said first and second branches in inverted relationship to said second summing network whereby to obtain said first named and second output signals which are complementary to each other.

17. The system according to claim 16 further comprising feedback circuit means for applying one of said first and second output signal to said branches together with said input signal.

18. The system according to claim 1 further comprising switching circuit means for controlling the direction of movement of the frequencies in said moving comb filter effect.

19. The system according to claim 18 wherein said switching circuit means is included in said frequency shifter means and has means for providing polarity reversals of signals therein.

20. The system according to claim 1 wherein said frequency shifter has means for providing first and second outputs from said first branch in response to an input audio signal which correspond to said input audio signal shifted up and down in frequency respectively, said summing circuit means including first and second summing circuits, said first and second outputs being connected to said first and second summing circuits, and said second branch being connected to both said first and second summing circuits whereby to provide a first output signal from said first summing circuit having a comb filter effect with filter frequencies moving in one direction and a second output signal from said second summing circuit also having a comb filter effect but with filter frequencies moving in a direction opposite from said one direction.

* * * * *